United States Patent
Maloney et al.

(10) Patent No.: US 9,459,299 B2
(45) Date of Patent: Oct. 4, 2016

(54) METHOD FOR MAKING A LOW DIFFUSE SCATTER, ANECHOIC CHAMBER ABSORBER

(76) Inventors: Kathleen C Maloney, Marietta, GA (US); James G Maloney, Marietta, GA (US); Rebecca B Schultz, Alpharetta, GA (US); John W Schultz, Alpharetta, GA (US)

( * ) Notice: Subject to any disclaimer, the term of this patent is extended or adjusted under 35 U.S.C. 154(b) by 248 days.

(21) Appl. No.: 13/539,066

(22) Filed: Jun. 29, 2012

(65) Prior Publication Data

US 2014/0259639 A1      Sep. 18, 2014

Related U.S. Application Data

(60) Provisional application No. 61/502,842, filed on Jun. 29, 2011.

(51) Int. Cl.
*H01F 7/06* (2006.01)
*G01R 29/08* (2006.01)

(52) U.S. Cl.
CPC ........ *G01R 29/0821* (2013.01); *Y10T 29/4902* (2015.01)

(58) Field of Classification Search
CPC ...... H01Q 17/00; H01Q 17/007; H01Q 1/38; H01Q 17/008; H01L 21/268; H01L 23/552; Y10T 428/12465; Y10T 428/24612; Y10T 428/24694
USPC ........... 29/602.1, 25.25, 594, 830, 846, 848, 29/858; 342/1, 4, 165; 703/1, 3
See application file for complete search history.

(56) References Cited

U.S. PATENT DOCUMENTS

| | | | |
|---|---|---|---|
| 5,331,567 A * | 7/1994 | Gibbons et al. | 703/1 |
| 6,359,581 B2 * | 3/2002 | Kurihara et al. | 342/4 |
| 7,250,920 B1 * | 7/2007 | Steinbrecher | H01Q 17/00 343/853 |

* cited by examiner

*Primary Examiner* — Thiem Phan
(74) *Attorney, Agent, or Firm* — Thomas|Horstemeyer, LLP.

(57) ABSTRACT

An electromagnetic chamber absorber provided improved absorption across a wideband and both lower diffuse and specular scatter and a method for constructing the same. An exemplary device can compromise a periodic arrangement of disconnected electromagnetically lossy elements where the periodicity of the lattice is adjusted to suppress all or most grating lobe scattering. Because the electromagnetically lossy elements are disconnected, scalable manufacturing approaches are enabled. The lossy elements can be easily fabricated via shaping, which includes rolling, folding and cutting resistive and/or magnetic sheet materials. The lossy elements can be repeatably placed in a periodic lattice using low density scaffolding approaches and/or other alignment mechanisms. The absorption at the lower frequency part of the electromagnetic bands (below 1-2 GHz) can be improved via the addition of parallel lossy sheets into the low-density scaffolding.

13 Claims, 8 Drawing Sheets

Square Lattice Arrangement

Hexagonal Lattice Arrangement

METHOD FOR MAKING A LOW DIFFUSE SCATTER, ANECHOIC CHAMBER ABSORBER

CROSS-REFERENCE TO RELATED APPLICATIONS

This application claims a benefit, under 35 U.S.C. §119 (e), of U.S. Provisional Application Ser. No. 61/502,842, dated 29 Jun. 2011, the entire contents and substance of which are hereby incorporated by reference.

BACKGROUND OF THE INVENTION

Anechoic chambers consist of shielded rooms with their interior surfaces lined with pyramidal or wedge shaped absorber. The absorber is designed to minimize the reflectivity of the wall over a wide range of radio frequencies (RF). Traditional anechoic chamber absorber consists of polymeric foam loaded with conductive carbon, which provides good near-normal incidence absorption of specular energy. The length of the absorber is related to the frequency over which it provides good absorption, and the thicker the absorber, the lower in frequency it can absorb. For example absorber that is 6 feet (1.8 m) tall can provide significant absorption down to approximately 200 MHz, while 18 inch (46 cm) tall absorber works only down to 1 GHz.

This conventional material is fundamentally limited because of diffuse scatter (tip diffraction) that increases the overall noise level in a chamber. Diffuse scatter, unlike specular reflection, occurs in many different directions for a given incidence of the RF energy. Tip diffraction is directly related to the periodicity of the pyramidal absorber, and occurs because the inherent inhomogeneity of a patterned structure with a periodicity that is large relative to the wavelength of the incident RF energy. For example, in typical 18 inch tall absorber, the pyramids are 6 inch square (i.e. each 2-foot square piece of absorber has a 4 by 4 array of pyramids) and diffraction effects can occur at frequencies above 1 GHz. Diffraction modes are also called grating modes or Floquet modes, and their angular position can be predicted with a diffraction equation. For a simple 1-dimensional grating the diffraction equation is, $d(\sin \theta_m + \sin \theta_i) = m\lambda$, where $\lambda$ is the wavelength, $\lambda_i$ is the incident angle, $\theta_m$ is the diffracted angle, d is the periodicity.

Because the possible diffraction modes are only dependent on periodicity (i.e. d), no amount of reshaping of the pyramids will move these modes. The only way to reduce the number of diffractive modes is to reduce the periodicity. This is why some anechoic chamber use wedge shaped absorber, rather than pyramids to minimize diffraction. The disadvantage of wedge absorber is that the 1-dimensional geometrical taper is not as effective as the 2-dimensional taper of the pyramids, so it is less effective in reducing specular reflectivity. Design of absorber in an anechoic chamber then becomes a compromise between specular performance and diffraction effects.

SUMMARY OF THE INVENTION

The present invention is directed to an anechoic chamber absorber and method for constructing the anechoic chamber absorber that has improved performance over conventional pyramidal absorbers, while simultaneously minimizing or eliminating diffuse scatter due to diffraction effects. To address this diffraction effect without reducing the specular performance, the present invention relies on a periodicity that is much smaller than the wavelength so that the onset of diffraction occurs well above the frequency band of interest. When the periodicity is smaller than half a wavelength, then it is referred to as electrically small, whereas a periodicity that is larger than a half wavelength is considered to be electrically large. Like pyramidal absorber, geometric tapering is used to obtain maximum specular absorption performance, but unlike pyramidal absorber, the geometrical or material tapering is applied within this electrically small periodicity. The relatively poor strength of pyramidal foam requires that pyramidal absorber is limited to geometrical shapes that can be self-supporting, which are necessarily electrically large. However, in the present invention, a different set of constitutive materials is used to enable the necessary tapers to be applied within an electrically small periodicity.

The anechoic chamber absorber suitable for absorbing electromagnetic radiation is made using resistive sheets that have been rolled or folded into elongated tubes. Resistive sheets may be made from a thin conductive layer supported on a dielectric substrate layer. Any suitable restive material may be used for the resistive layer, including thin sputtered or evaporated metal alloys, carbon loaded inks, or carbon or metal embedded in a polymer matrix. The specific electromagnetic properties of these thin sheets are usually specified in terms of sheet impedance, which is in units of ohms per square. Typical values of resistive sheets for this application may range from a few ohms per square to thousands of ohms per square depending on the performance requirements. One low cost supply for resistive sheets is commercially available window tint; while the material is typically described in terms of amount of light transmission, the material is often electromagnetically lossy and can be used to form these elongated tubes.

Each of the individual elongated tubes has a front side and a back side (See FIG. 6), where the back side (i.e. metal backed 10) is placed against the walls of the anechoic chamber and the front side faces (i.e. physically tapered 3) towards the inside of the chamber. The diameter or width of the tube should be no more than a half of a wavelength in size for the frequency band of interest. The front side of each resistive tube can be tapered either geometrically, or with varying resistivity to provide a gradual change in resistivity from the front of the tube to the middle or back of the tube. With a geometric taper, the tube is simply cut with a slant cut so that it forms a point at the front side. Performance can be further improved with more elaborate physical shaping of the end.

The anechoic absorber is constructed by assembling the tapered tubes into a periodic array with a periodicity or spacing that is preferably less than a half-wavelength in the frequency band of interest. This electrically small spacing has the advantage of preventing diffuse scatter modes from occurring, providing an absorber that is inherently quieter (i.e. less diffuse and specular scattering) than traditional pyramidal absorber. Another advantage of this invention is the hollow construction of the tubes. This hollow construction provides a very light-weight construction for easier mounting of the absorber onto walls or ceilings. Additionally, it provides a mechanism for convective cooling in high-power applications, where the absorber can be actively cooled.

Other features and advantages of the invention will appear from the following description in which the preferred embodiments have been set forth in detail in conjunction with the accompanying drawings.

DESCRIPTION OF THE PREFERRED EMBODIMENTS

Figure 1:
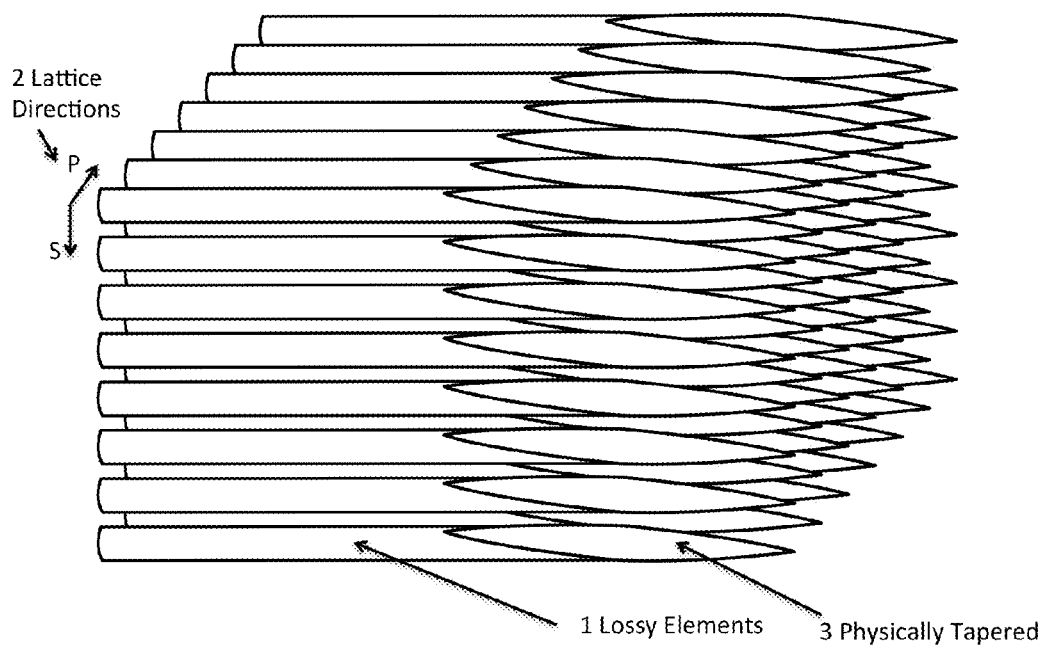
FIG. 1 is a perspective view of a block of the present invention showing a multiplicity of periodic lossy elements with physically tapered ends.

FIG. 1 shows one of the simplest preferred embodiments. Lossy elements 1 are placed periodically at the sites of a lattice formed from two non-coincident lattice directions 2, denoted S and P. FIG. 1 shows the case where S and P are orthogonal forming a rectangular lattice. The lossy elements 1 have physically tapered 2 ends to better absorb the incident electromagnetic energy.

In the preferred embodiments the physically tapered 2 ends are a simple linear bevel as shown in FIG. 1. In alternate embodiments the curvature of the physical shaping would be optimized using computational electromagnetic tools.

Figure 2:
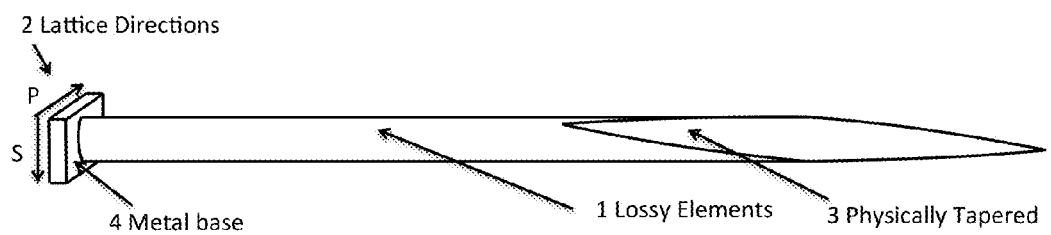
FIG. 2 is a perspective view of a single unit cell of a lossy elements with a metal base that is used to insure uniformity of spacing.

FIG. 2 shows an embodiment for forming the lossy elements 1 with metal bases 4 where the size of the metal base 4 matches the periodic lattice 2 in shape and size. These metal bases 4 of the lossy elements 1 when placed in the periodic arrangement would form a continuous metal backplane. Also, these metal bases 4 would provide a means for insuring the proper periodic spacing and alignment. In some embodiments the lossy elements 1 can be formed from classical absorber materials such as volumetrically lossy materials like carbon loaded foam as long as the periodic elements are disconnected from each other.

Notice, that one unique feature of this new absorber is the disconnected nature of the periodic elements. Classical absorbers such as lossy pyramidal foam and carbon loaded honeycomb structures are connected lossy structures. Disconnecting the lossy elements fundamentally changes the frequency dependent nature of the loss mechanism which is fully modeled in our design approach and leads to scalable manufacturing.

Figure 3:
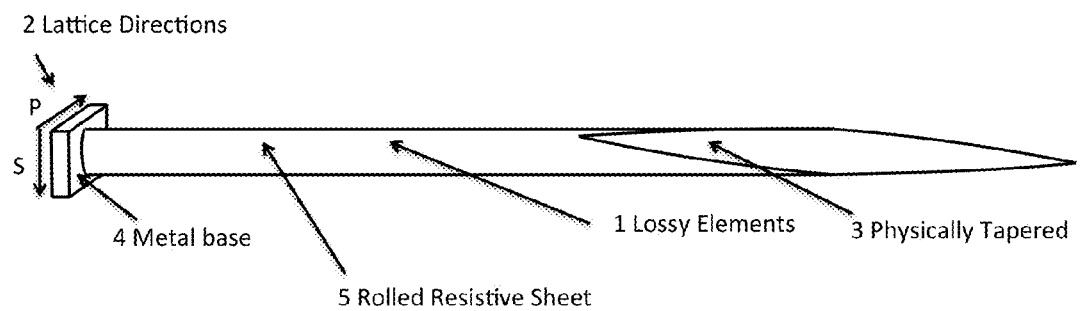
FIG. 3 is a perspective view of a single unit cell where the lossy element is formed by rolling a resistive sheet with a metal base that is used to insure uniformity of spacing.
Figure 4:
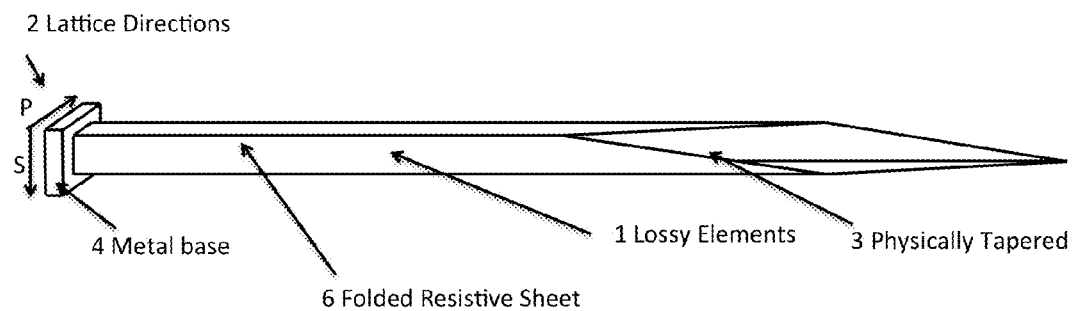
FIG. 4 is a perspective view of a single unit cell where the lossy element is formed by folding a resistive sheet with a metal base that is used to insure uniformity of spacing.

FIG. 3 further refines the embodiment by showing that the lossy elements 1 are formed by rolled resistive sheets 5. FIG. 4 shows an alternate embodiment where the lossy elements 1 are formed by a folded the resistive sheets 6. Alternate embodiments include the use of magram sheets. The lossy elements 1 would be formed from rolled or folded magram sheets in these alternate embodiments. Even combinations of resistive and magram sheets are envisioned where one is rolled inside the other. Each material has advantages and disadvantages. The resistive sheets are the lightest weight choice and are commercially available as resistive cards (Rcards). The magnetic (magram) materials are heavier but also are commercially available in sheet form. Magram is particularly attractive at absorbing lower frequency electromagnetic energy (below 1-2 GHz) and thus depending on the end-user requirements, the lossy elements 1 may be best made by trading between resistive and/or magram sheets.

Figure 5:
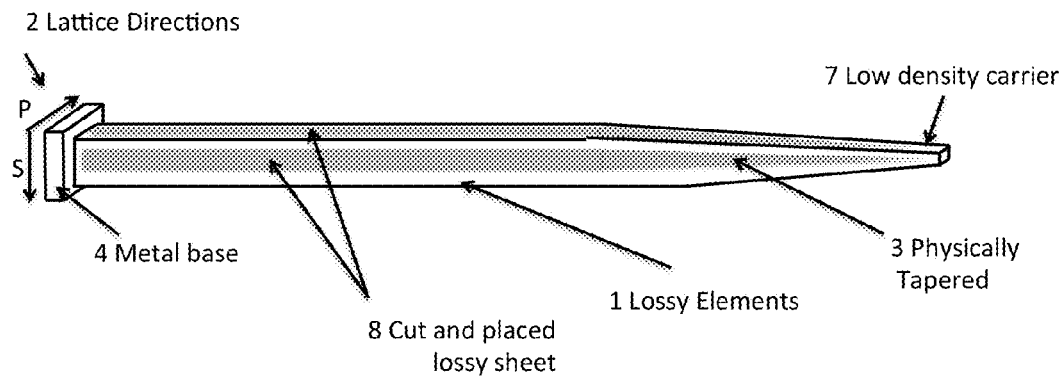
FIG. 5 is a perspective view of a single unit cell where the lossy element is formed by cutting and placing a lossy sheet on a low density carrier with a metal base that is used to insure uniformity of spacing.

FIG. 5 shows one more embodiment for physically realizing lossy elements 1. In this embodiment, a low density carrier 7 is used to carry cut and placed lossy sheets 8. The cut and placed sheets 8 can be placed on one or more sides of the low density carrier 7. Depending on the material properties of the materials designs may meet the absorption targets using less all the surfaces. However, to absorb both polarizations of electromagnetic energy at least two non-parallel sides should be used. Best performance may come from using all four sides at the addition of more complexity. Notice the both the low density carrier 7 and cut and pasted lossy sheets 8 have physically tapered 3 ends. The need to physically taper 3 ends is required on both lossy and non-lossy materials in order to meet the greatest levels of absorption that are becoming commercially required.

Figure 6:
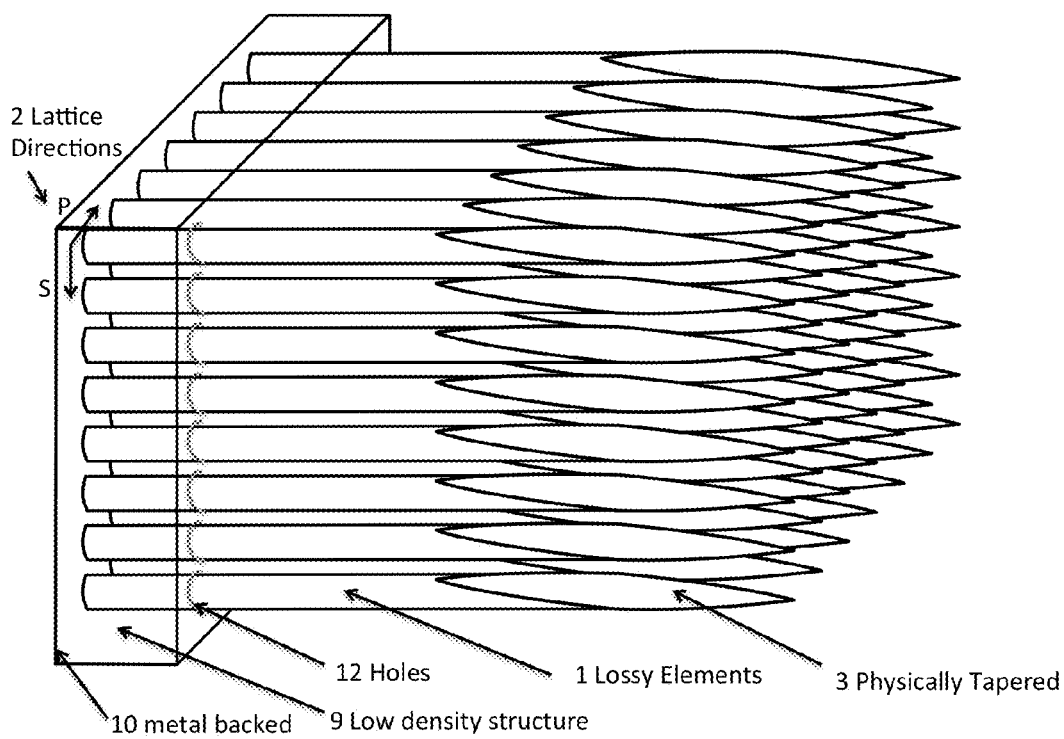
FIG. 6 is a perspective view of a block of the present invention showing a multiplicity of periodic lossy element with a low density support scaffold used at the base to maintain the lossy elements in a fixed array.

FIG. 6 shows an alternate embodiment where a low density structure 9 is used to support the lossy elements 1 on the periodic lattice 2. The low density structure 9 can be formed from low density materials such as foam and honeycomb. For solid materials like foam, periodic holes 12 would be formed using water-jet cutting or similar technology. For non-solid materials like honeycomb, the preferred embodiment would have the honeycomb lattice match the desired lattice of the absorber but alternatively the lattice could be smaller and holes could be cut at the required sites. Depending on end-user usage, the low density structure 9 may be optionally metal-backed 10 to insure consistent performance and provide further shielding. This metal backing can be formed easily from various metal foils to keep the mass low or from thicker metal honeycomb to add structural properties.

Figure 7:
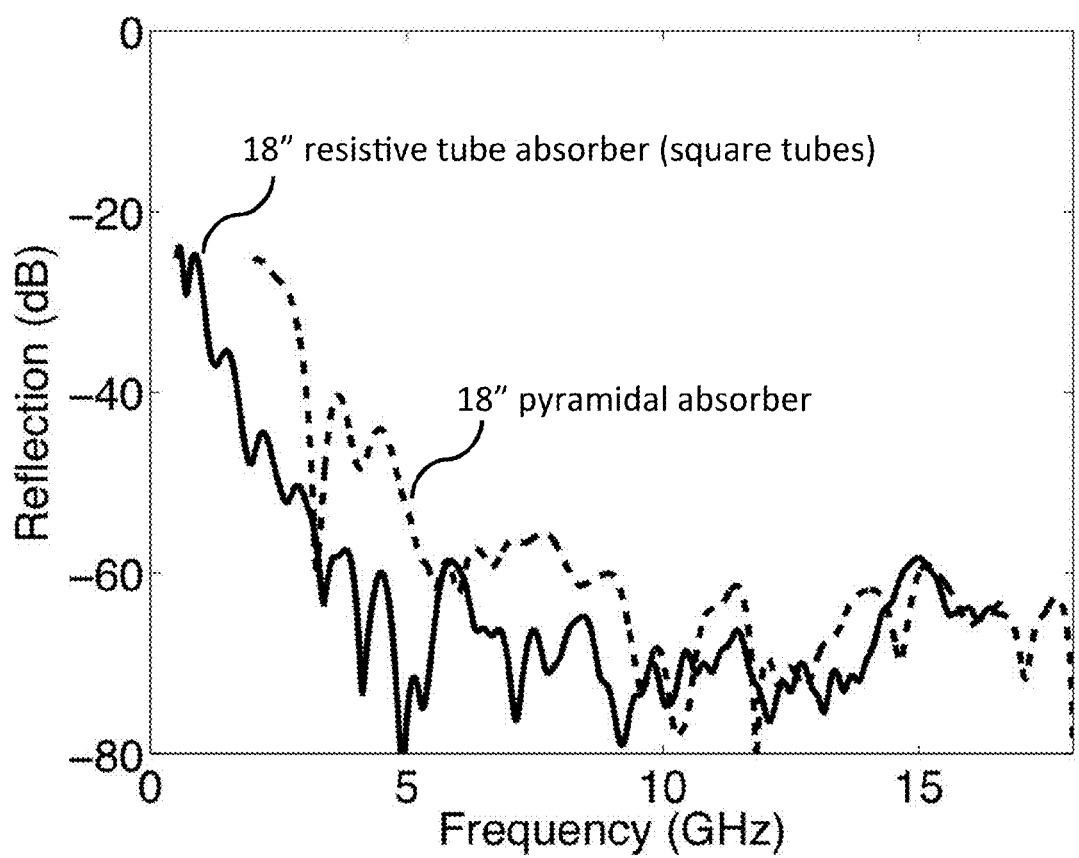
FIG. 7 illustrates a plot of reflectivity versus frequency for an 18 inch thick absorber, including the calculated reflectivity according to the present invention and measured reflectivity for traditional carbon loaded pyramidal foam.

FIG. 7 shows a performance prediction for an 18" thick design where the lossy elements 1 are formed into 1.4 cm diameter elongated tubes from folded resistive sheets 6. The lossy elements are arranged on a rectangular lattice of 2 cm spacing. A series of electromagnetic simulations are performed using state-of-the-art computational electromagnetic codes to optimize the properties of the folded resistive sheets 6 and the length of the physically tapered 2 ends. The solid line in FIG. 6 shows the absorption of a sample design compared with conventional 18-inch thick pyramidal absorber (dashed line) showing the superior performance possible from this new approach to absorber.

Figure 8:
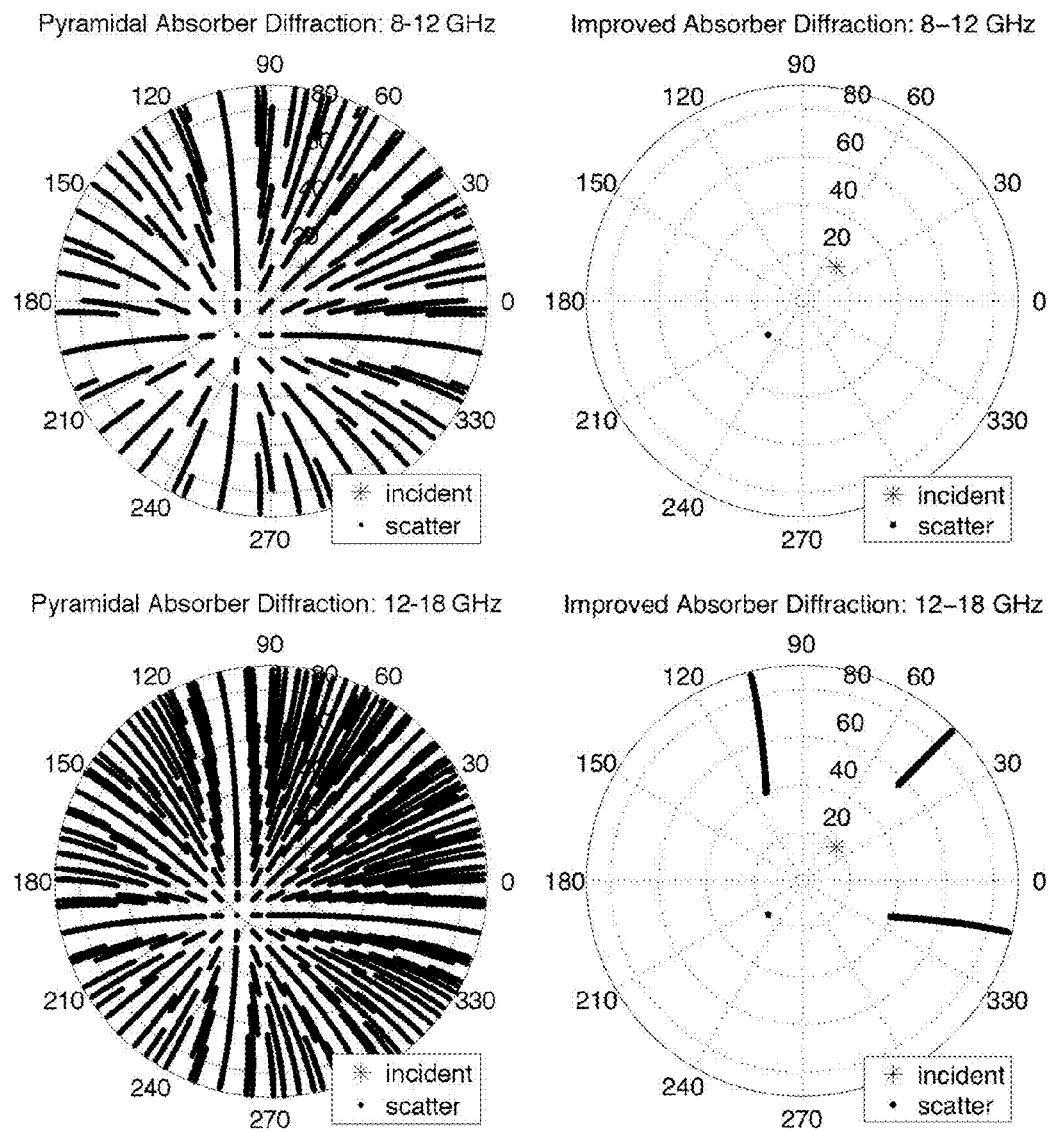
FIG. 8 shows a comparison of the allowed scattering grating lobe directions between the traditional pyramidal absorber (left hand side) to the present invention (right hand side) at two frequency bands.

FIG. 8 shows the improvement in diffuse scatter for this new approach to absorber. The plots on the right hand side show the allowed scattering directions for the new, low diffuse scatter absorber that is the subject of this utility patent compared to the conventional pyramidal absorber shown on the left hand side. The top figures show the modes for 8-12 GHz and the bottom figures show 12-18 GHz. Each black dot is are the location of a potential scattering grating lobe. The size of the traditional pyramidal absorber has a tremendous number of allowed scattering grating lobe directions as evidenced by the near solid black coverage of the left hand side plots. The new, low diffuse scatter absorber has a periodicity of 2 cm and thus there are no allowed grating lobe scattering directions until above 12 GHz as evidence by the single specular scatter black dot in the top right plot and only a smaller number of possible grating scatter directions from 12-18 GHz in the bottom plot. Clearly the ability to form absorber using disconnected tubes allows us to choose the tube diameter and lattice spacing to eliminate or greatly reduce the number grating lobes up to desired frequencies.

Figure 9:
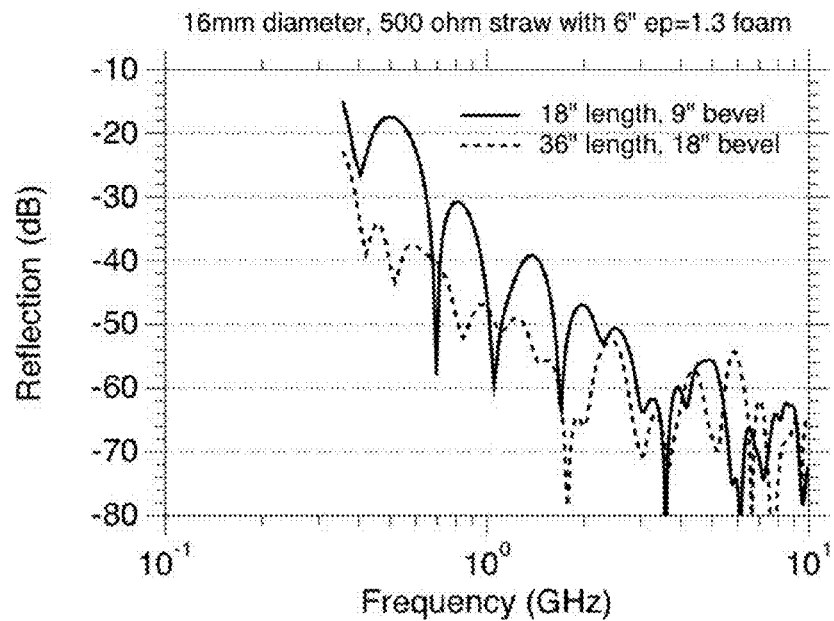
FIG. 9 illustrates a plot of reflectivity versus frequency for a 36 inch thick absorber according to the present invention compared to a comparable 18 inch design.

FIG. 9 shows how the performance of the folded resistive sheet 6 embodiment can be further improved by lengthening the tubes. The dashed line is an optimized design for 36-inch length compared to a comparable 18-inch design (solid line). The 36-inch design is clearly superior. Hence, with this new approach to absorber, various length lossy elements 1 can be fashioned to meet the levels of desired performance of each customer.

Figure 10:
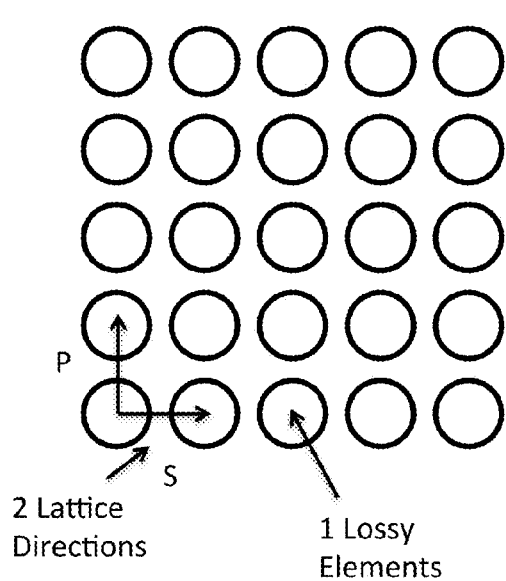
FIG. 10 is an illustration of square lattice and hexagonal lattice configurations for the present invention.
Figure 10:
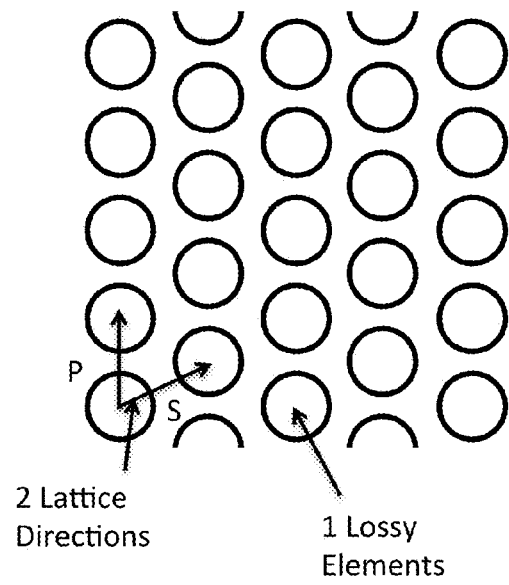

Alternate embodiments can utilize other periodic arrangements of lossy elements 1. FIG. 10 shows two preferred arrangements. The drawing on the left shows the square lattice arrangement where the lattice directions 2 are perpendicular and the lattice spacings are equal. The drawing on the right shows the hexagonal lattice arrangement where the lattice directions 2 are separated by 60 degrees and the lattice spacings are equal. Other embodiments are envisioned using other lattice spacings but the choice of lattice would be largely chosen based on the topology and size of the area to be covered with absorber and the spacing would be chosen to meet the electromagnetic diffuse scatter requirements.

Figure 11:
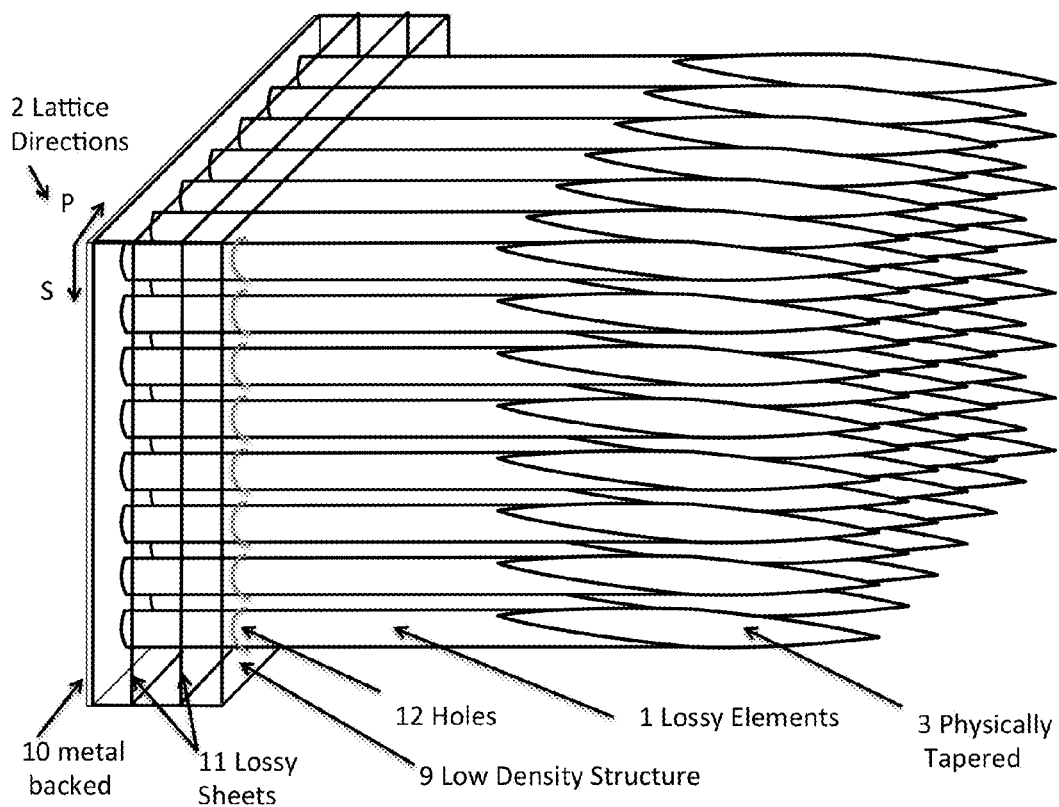
FIG. 11 is a perspective view of a block of the present invention combined with three parallel resistive sheets tuned to extend the low frequency performance.
Figure 12:
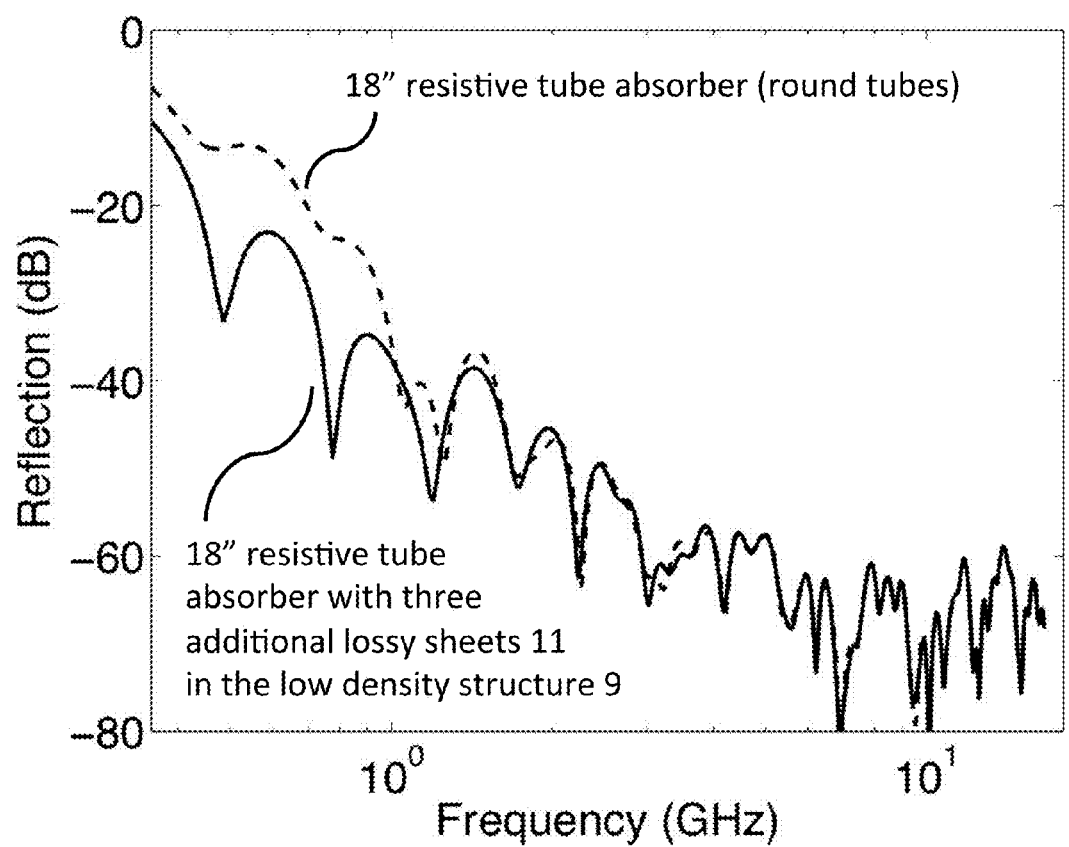
FIG. 12 illustrates a plot of reflectivity versus frequency for an 18 inch thick absorber with just restive tubes compared to a similar absorber with both resistive tubes and parallel resistive sheets in the low density structure.

FIG. 11 shows an alternate embodiment with improved performance. The performance improvement comes from the addition of one or more lossy sheets 9 into the low density structure 9. The material properties and placement of these lossy sheets 11 are optimized using a series of electromagnetic simulations are performed using state-of-the-art computational electromagnetic codes. FIG. 12 shows how the addition of these lossy sheets 11 allows improved low frequency (below 1-2 GHz) absorption.

This embodiment shows how we can tailor the loss to best meet end-user requirements. For example, typically the high frequency (above 1-2 GHz) absorption is typically good enough for a typical thickness of 18-36" but often the low frequency absorption is not enough. By including a number of parallel lossy sheets into the low density support, the low frequency performance can be improved somewhat independently of the high frequencies. Of course, for final design would include all the details in the computational model to ensure absorption across the full frequency band.

What is claimed is:

1. A method of making an anechoic chamber absorber comprising placing a periodic arrangement of disconnected, electromagnetically lossy elements on a lattice described by two non-coincident lattice directions, where the electromagnetically lossy elements are free-standing tubular structures having a first section extending from the lattice at a proximal end and a second section extending from a distal end of the first section to a distal end of that electromagnetically lossy element, where a cross-sectional shape of the tubular structure is constant along an axial length of the first section and is tapered along an axial length of the second section, where the second section is tapered along a plane that extends from one side of the tubular structure at the distal end of the first section to an opposite side of the tubular structure at the distal end of that electromagnetically lossy element, where no structures are disposed between adjacent first sections and between adjacent second sections of adjacent electromagnetically lossy elements extending from the lattice in the periodic arrangement.

2. The method of claim 1 where the electromagnetically lossy elements are formed by rolling resistively coated sheets into tubes.

3. The method of claim 1 where the electromagnetically lossy elements are formed by rolling magnetic ram sheets into tubes.

4. The method of claim 1 where the electromagnetically lossy elements are formed by folding electromagnetically lossy sheets into tubes.

5. The method of claim 1 where the electromagnetically lossy elements are formed by cutting and placing shaped pieces of electromagnetically lossy materials onto low density carriers.

6. The method of claim 1 where the electromagnetically lossy elements are formed from window tint materials.

7. The method of claim 1 where the electromagnetically lossy elements are physically tapered by shaping the ends.

8. The method of claim 1 where the electromagnetically lossy elements are formed from coincident tubes made from resistively coated sheets and magram sheets.

9. The method of claim 1 where the electromagnetically lossy elements are tapered by geometrically grading the material properties of the elements.

10. The method of claim 1 where the lattice directions are orthogonal forming a rectangular array.

11. The method of claim 1 where the lattice directions are separated by 60 degrees forming a hexagonal lattice, wherein electromagnetically lossy elements immediately adjacent to one of the electromagnetically lossy elements are spaced at 60 degree intervals thereby forming the hexagonal lattice.

12. The method of claim 1 where the anechoic chamber absorber is configured to absorb electromagnetic waves in a frequency range having an upper frequency with a wavelength, wherein the periodic arrangement has a lattice spacing of the disconnected, electromagnetically lossy elements that is equal to or less than one-half of the wavelength of the upper frequency.

13. The method of claim 1 where the electromagnetically lossy elements are placed perpendicular to the lattice.

* * * * *